(12) United States Patent
Liu et al.

(10) Patent No.: US 6,580,630 B1
(45) Date of Patent: Jun. 17, 2003

(54) INITIALIZATION METHOD OF P-TYPE SILICON NITRIDE READ ONLY MEMORY

(75) Inventors: Chien-Hung Liu, Taipei (TW); Shou-Wei Huang, Chilung (TW); Shyi-Shuh Pan, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/165,715

(22) Filed: Jun. 7, 2002

(30) Foreign Application Priority Data

Apr. 2, 2002 (TW) ........................................ 91106568 A

(51) Int. Cl.[7] .......................... G11C 13/00; G11C 16/04
(52) U.S. Cl. .................................. 365/106; 365/185.32
(58) Field of Search ............................. 365/106, 185.32

(56) References Cited

U.S. PATENT DOCUMENTS 6,437,398 B2 * 8/2002 Widdershoven ............. 257/323

OTHER PUBLICATIONS

"M27C64A: 64 Kbit (8Kb×8) UV EPROM and OTP EPROM", Sep. 2000, STMicroelectronics.*

* cited by examiner

Primary Examiner—Richard Elms
Assistant Examiner—Jung H. Hur
(74) Attorney, Agent, or Firm—J.C. Patents

(57) ABSTRACT

The presents invention provides an initialization method of a P-type silicon nitride read only memory. A P-type silicon nitride read only memory is provided. An ultra-violet light is uniformly radiated onto the P-type silicon nitride read only memory. Electron traps are thus evenly distributed in a silicon nitride layer of the P-type silicon nitride read only memory. The P-type silicon nitride read only memory is thus uniformly programmed to a low threshold voltage (Low|Vt|) to achieve the device initialization effect.

11 Claims, 1 Drawing Sheet

INITIALIZATION METHOD OF P-TYPE SILICON NITRIDE READ ONLY MEMORY

CROSS-REFERENCE TO RELATED APPLICATION

This application claims the priority benefit of Taiwanese application serial no. 91106568, filed on Apr. 2, 2002.

BACKGROUND OF THE INVENTION

1. Field of the Invention

The invention relates in general to an initialization method of a semiconductor memory, and more particularly, to an initialization method of a P-type silicon nitride read only memory (NROM).

2. Description of the Related Art

The flash memory is a kind of electrically erasable and programmable read only memory (EEPROM) with the capability of saving, reading and erasing data multiple times. Moreover, the data saved in the flash memory does not disappear even when the electricity is interrupted. It thus has become one of the most commonly used memory devices for personal computers and electronic equipment.

The typical flash memory uses a doped polysilicon layer to fabricate the floating gate and the control gate. When a memory is programmed, appropriate programming voltages are applied to the source region, the drain region and the control gate, respectively. The electrons then flow from the source region to the drain region via the channel. In this process, some of the electrons tunnel through the tunneling oxide layer under the floating gate and are evenly distributed in the control gate. The electron tunneling effect through the tunneling oxide to the control gate can be divided into two situations. One is called "channel hot-electron injection"; the other is called "Fowler-Nordheim tunneling". Normally, channel hot-electron injection is applied to program the flash memory, and Fowler-Nordheim tunneling is applied to the side of the source region and the channel region when erasing. However, if the tunneling oxide layer under the floating gate has weak point, a leakage current of the device is easily caused to affect the reliability of the device.

One conventional method of resolving the problem of device leakage uses a charge trap layer to replace the polysilicon floating gate. The material of the charge trap layer includes silicon nitride. An EEPROM with a stacked gate structure made of a silicon oxide/silicon nitride/silicon oxide (ONO) stacked layer is thus formed. Since the material of the charge trap layer is silicon nitride, this kind of EEPROM is called silicon nitride read only memory (NROM). As the silicon nitride layer has the function of trapping charges, the electrons injected into the silicon nitride floating gate are not uniformly distributed. Instead, the electrons are distributed in a Gaussian distribution in the local area of the silicon nitride floating gate. Since the injected electrons are concentrated in a local area of the silicon nitride floating gate, the sensitivity of the weak points is small, and the device leakage does not easily occur.

Another advantage of using the silicon nitride floating includes that the electrons are locally stored in the channel region close to the upper part of the source or drain region. Therefore, while programming, voltages can be applied to the source/drain region at two sides of the stacked gate and the control gate respectively, so that a Gaussian distribution of electrons is generated in the silicon nitride floating gate near another side of the source/drain region. By changing the voltages applied to the control gate and the source/drain region, two groups of Gaussian distributed of electrons, one group of Gaussian distributed of electrons, or non-existence of electrons can be obtained in the floating gate. Therefore, using silicon nitride as the material for fabricating the floating gate, four statuses can be written into a single memory cell of the flash memory. The flash memory is a kind of a 1 cell 2 bit flash memory.

FIG. 1 shows a structure of conventional silicon nitride read only memory. The silicon nitride read only memory comprises a substrate 100, a silicon oxide/silicon nitride/silicon oxide (ONO) layer 102 on the substrate 100, and a gate conductive layer 110 on the ONO layer 102. The ONO layer 102 further comprises the silicon oxide layer as the tunneling oxide layer 104, the silicon nitride layer 106, and the silicon oxide layer 108 as the dielectric layer. The gate conductive layer 110 includes a polysilicon layer. A source region 112 and a drain region 114 are formed in the substrate 100 at two sides of the ONO layer 112. The silicon nitride read only memory further comprises a channel region 116 under the ONO layer 102 and between the source region 112 and the drain region 114. In addition, pocket implant regions 118 are formed in the substrate 100 between the ONO layer 102 and the drain region 114, and between the ONO layer 102 and the source region 112.

In the conventional silicon nitride read only memory, the source region 112, the drain region 114 are doped with the same conductive type, for example, P-type or N-type. Thus, a P-type silicon nitride read only memory has P-type source region 112, drain region 114. The pocket implant regions 118 are doped with N-type dopants to increase the PN junction concentration so as to increase the electric field.

In the typical process for fabricating the silicon nitride read only memory, due to the influence of the process environment, for example, using plasma to generate electrons from the substrate, some electrons 120 are stored in the silicon nitride layer 106 to cause a non-uniform program of the read only memory. The electrons 120 stored into the silicon nitride layer 106 are non-uniform and cause different initialization statuses for each device. In addition, the electrons stored in the silicon nitride layer 106 are difficult to eliminate and cause the difficulty when used for the first time. To solve the above problem, one can only avoid the injection of electrons into the silicon nitride layer 106. A good initialization method is still lacking.

SUMMARY OF THE INVENTION

The invention provides an initialization method of a P-type silicon nitride read only memory. After the P-type silicon nitride read only memory is fabricated, an ultraviolet light is uniformly radiated on the P-type silicon nitride read only memory. Consequently, a uniform distribution of electron traps is obtained in the silicon nitride layer of the P-type silicon nitride read only memory. The device is thus maintained at a status with a low threshold voltage (Low|Vt|) to achieve an initialization effect.

In the invention, using the radiation of an ultra-violet light, the device can obtain a unique threshold voltage Vt no matter what the process condition is.

Both the foregoing general description and the following detailed description are exemplary and explanatory only and are not restrictive of the invention, as claimed.

DESCRIPTION OF THE PREFERRED EMBODIMENTS

Figure 1:
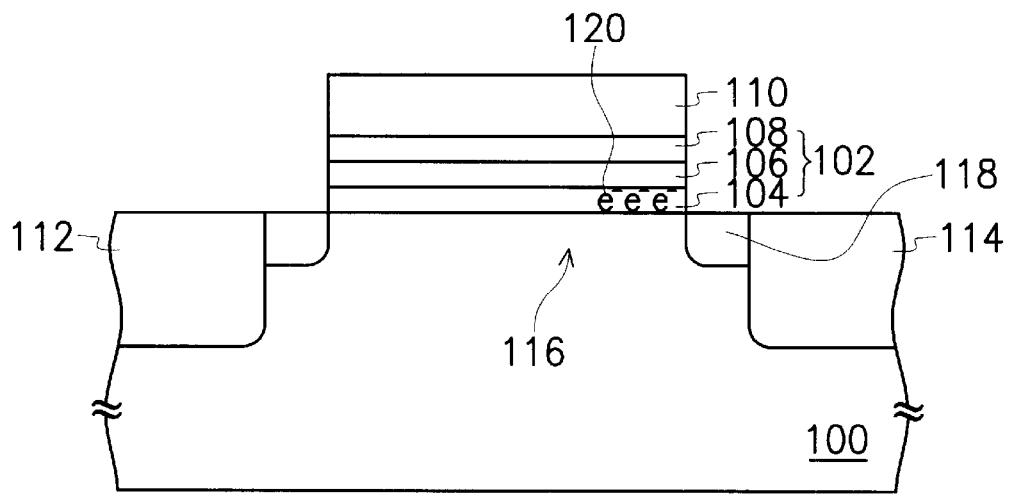
FIG. 1 is a structure of a conventional silicon nitride read only memory.
Figure 2:
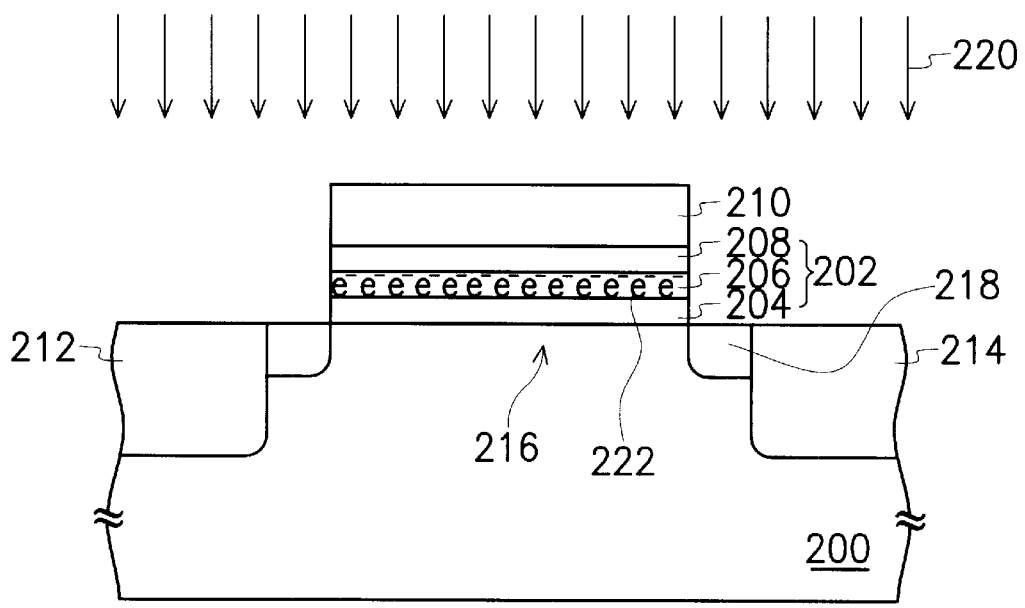
FIG. 2 shows the initialization method of a P-type silicon nitride read only memory.

FIG. 2 shows the initialization method of a P-type silicon nitride read only memory.

In FIG. 2, a P-type silicon nitride read only memory is provided. The P-type silicon nitride read only memory comprises a substrate 200, a tunneling oxide layer 204, a silicon nitride layer 206 and a silicon oxide dielectric layer 208 on the substrate 200, and a gate conductive layer 210. The tunneling oxide layer 204, the silicon nitride layer 206 and the silicon oxide dielectric layer 208 form a stacked ONO structure 202. Preferably, the gate conductive layer 210 comprises a polysilicon layer. The P-type silicon nitride read only memory further comprises a source region 212 and a drain region 214 at two sides of the ONO structure 202 in the substrate 200, and a channel region 216 between the source region 212 and the drain region 214. Between the source region 212 and the channel region 216, and between the drain region 214 and the channel region 216, the P-type silicon nitride read only memory further comprises pocket implant regions 218. The pocket implant regions 218 have a conductive type opposite to those in the source region 212, the drain region 214. For example, in the P-type silicon nitride read only memory, the source region 212 and the drain region 214 are doped with P-type dopants, while the pocket implant regions 218 are doped with N-type dopants. In addition, the silicon nitride layer 206 is used as the floating gate, while the gate conductive layer 210 is used as the control gate of the P-type silicon nitride read only memory.

An ultra-violet light 220 is uniformly radiated onto the P-type silicon nitride read only memory. The wavelength of the ultra-violet light 220 is about 100 nm to about 500 nm, for example. The energy density is about 1 mW/cm$^2$ to about 15 mW/cm$^2$, for example. Preferably, the radiation time is about 5 min to about 50 min. The gate conductive layer 210 can be P-type doped by implanting P-type ions or N-type doped by in-situ doping N-type ions. The pocket implant regions 218 can be optional.

When the ultra-violet light 220 is radiated onto the whole P-type silicon nitride read only memory, the energy thereof generates electrons 222 and holes. When the energy reaches a certain level, the electrons 222 are then stored in the silicon nitride layer 206 through the silicon oxide layer 204. The stored electrons 222 are evenly distributed in the silicon nitride layer 206 as the electron traps. As a result, the device is uniformly programmed at a low threshold voltage status (Low|Vt|). Therefore, being radiated with the ultra-violet light, each device can obtain a unique threshold voltage Vt to achieve the initialization effect.

Therefore, the invention uses an ultra-violet light to radiate a P-type silicon nitride read only memory to obtain a uniform distribution of electron traps in the silicon nitride floating gate. Consequently, no matter how the process condition is, the device is uniformly programmed to a low threshold voltage (Low status|Vt|) to achieve the initialization.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. An initialisation method of a P-type silicon nitride read only memory, the method comprising:
    providing a P-type silicon nitride read only memory, wherein the P-type silicon nitride read only memory comprises a silicon nitride floating gate; and
    radiating an ultra-violet light on the P-type silicon nitride read only memory uniformly to cause a uniform distribution of electron traps in the silicon nitride floating gate, so as to uniformly program the P-type silicon nitride read only memory to a low threshold voltage status to achieve initialization.

2. The method according to claim 1, wherein the ultra-violet light has a wavelength of about 100 nm to about 500 nm.

3. The method according to claim 2, wherein the ultra-violet light is radiated for about 5 min to about 50 min.

4. The method according to claim 2, wherein providing the energy includes providing the energy for about 5 min to about 50 min.

5. The method according to claim 1, wherein the ultra-violet light has an energy density of about 1 mW/cm$^2$ to about 15 mW/cm$^2$.

6. The method according to claim 1, wherein providing the energy includes providing the energy with an energy density of about 1 mW/cm$^2$ to about 15 mW/cm$^2$.

7. An initialization method of a P-type silicon nitride read only memory, comprising:
    providing a P-type silicon nitride read only memory, wherein the P-type silicon nitride read only memory comprises a silicon nitride floating gate; and
    uniformly providing an energy on the P-type silicon nitride read only memory to cause a uniform distribution of electron traps in the silicon nitride floating gate, so as to uniformly program the P-type silicon nitride read only memory to a low threshold voltage status to achieve initialization.

8. The method according to claim 7, wherein providing the energy includes radiating an ultra-violet light.

9. The method according to claim 8, wherein the ultra-violet light has a wavelength of about 100 nm to about 500 nm.

10. The method according to claim 8, wherein the ultra-violet light has an energy density of about 1 mW/cm$^2$ to about 15 mW/cm$^2$.

11. The method according to claim 8, wherein the ultra-violet light is radiated for about 5 min to about 50 min.

* * * * *